US012148590B2

(12) United States Patent
Rodrigues et al.

(10) Patent No.: US 12,148,590 B2
(45) Date of Patent: Nov. 19, 2024

(54) FAULT CURRENT DETECTION FOR SOLID-STATE CIRCUIT BREAKERS AND METHOD OF OPERATING SOLID-STATE CIRCUIT BREAKERS

(71) Applicant: ABB Schweiz AG, Baden (CH)

(72) Inventors: Rostan Rodrigues, Cary, NC (US); Pietro Cairoli, Cary, NC (US); Utkarsh Raheja, Sunnyvale, CA (US)

(73) Assignee: ABB Schweiz AG, Baden (CH)

( * ) Notice: Subject to any disclaimer, the term of this patent is extended or adjusted under 35 U.S.C. 154(b) by 221 days.

(21) Appl. No.: 17/894,740

(22) Filed: Aug. 24, 2022

(65) Prior Publication Data
US 2024/0071704 A1    Feb. 29, 2024

(51) Int. Cl.
*H01H 71/12*    (2006.01)
*H01L 29/747*    (2006.01)
(Continued)

(52) U.S. Cl.
CPC ......... *H01H 71/123* (2013.01); *H01L 29/747* (2013.01); *H02H 1/0007* (2013.01); *H02H 3/093* (2013.01)

(58) Field of Classification Search
CPC .... H02H 3/006–007; H02H 3/05; H02H 3/08; H02H 3/081; H02H 3/083;
(Continued)

(56) References Cited
U.S. PATENT DOCUMENTS 4,689,712 A    8/1987 Demeyer
5,687,049 A    11/1997 Mangtani
(Continued)

FOREIGN PATENT DOCUMENTS

CN    1402404 A    3/2003
CN    101702506 A    5/2010
(Continued)

OTHER PUBLICATIONS

Rodrigues et al., "Robust 5 kA, 1 kV Solid-State DC Circuit Breaker for Next Generation Marine Power Systems" IEEE Electric Ship Technologies Symposium (ESTS), 2021, pp. 1-7.
(Continued)

*Primary Examiner* — Tuan T Dinh
(74) *Attorney, Agent, or Firm* — McCarter & English, LLP

(57) ABSTRACT

Solid-state circuit breakers and method of operating same are provided. A solid-state circuit breaker (SSCB) is configured to generate a first output representative of a current through a current path of the SSCB. An analog fault detection circuit is coupled with first output and is configured to assert a second output in response to the current exceeding a trip current level. At least one analog-to-digital converter (ADC) is configured to generate samples of the first output, where the at least one ADC has a di/dt detection bandwidth that is less than a di/dt detection bandwidth of the analog fault detection circuit. The SSCB is further configured to disable the current path through the SSCB in response to determining, asynchronously, that either the second output is being asserted by the analog fault detection circuit or the samples indicate that the current through the current path exceeds the trip current level.

21 Claims, 12 Drawing Sheets

(51) Int. Cl.
*H02H 1/00* (2006.01)
*H02H 3/093* (2006.01)

(58) Field of Classification Search
CPC ......... H02H 3/093; H02H 3/023; H02M 1/08; H02M 1/083; H02M 1/096; H02M 1/32
USPC ................... 361/42–50, 56, 63–65, 111, 115
See application file for complete search history.

(56) References Cited

U.S. PATENT DOCUMENTS

| | | | |
|---|---|---|---|
| 6,577,138 B2 | 6/2003 | Zuercher et al. | |
| 6,731,116 B2 | 5/2004 | Yamamoto et al. | |
| 6,999,291 B2* | 2/2006 | Andarawis | H02H 7/263 |
| | | | 361/64 |
| 8,675,325 B2* | 3/2014 | Beierschmitt | H01H 71/123 |
| | | | 361/78 |
| 9,667,060 B1 | 5/2017 | Sizikov | |
| 10,887,964 B1* | 1/2021 | Garrasi | H02H 3/20 |
| 11,264,790 B2 | 3/2022 | Cairoli et al. | |
| 11,303,111 B2* | 4/2022 | Butler | H02H 9/001 |
| 2013/0050880 A1* | 2/2013 | Rozman | H02H 3/025 |
| | | | 361/18 |
| 2014/0029152 A1* | 1/2014 | Mazzola | H03K 17/6871 |
| | | | 361/115 |
| 2020/0106260 A1* | 4/2020 | Telefus | H03K 17/687 |
| 2020/0211792 A1* | 7/2020 | Manahan | H01H 9/042 |
| 2020/0365345 A1 | 11/2020 | Telefus | |
| 2021/0234361 A1 | 7/2021 | Zhou | |
| 2022/0178999 A1* | 6/2022 | Rodrigues | G01R 31/2829 |

FOREIGN PATENT DOCUMENTS

| | | |
|---|---|---|
| GB | 2527534 A | 12/2015 |
| JP | H10-336874 A | 12/1998 |
| JP | 2001-309546 A | 11/2001 |

OTHER PUBLICATIONS

Partial Search Report for European Patent Application No. 23190646.2, dated Jan. 30, 2024, 22 pps.
European Office Action for Application No. 23190646.2, dated Apr. 23, 2024, 16 pages.
Japanese Office Action for JP App. No. 2023-134338; Dated Aug. 27, 2024; 7 Pages.

* cited by examiner

FAULT CURRENT DETECTION FOR SOLID-STATE CIRCUIT BREAKERS AND METHOD OF OPERATING SOLID-STATE CIRCUIT BREAKERS

BACKGROUND

The field of the disclosure relates to fault detection, and more particularly, to fault detection in systems that present low inductances to a fault, which can result in high di/dt fault currents.

Direct current (DC) distribution systems provide benefits to customers for systems such as marine distribution systems, battery energy storage systems, microgrids, and datacenters. DC power distribution systems are characterized by a variety of configurations, including the use of power converters and capacitor storage or other storage systems coupled to the DC distribution bus. These types of DC distribution busses may present a low inductance to potential short circuits, which can pose a challenge for fault current detection, interruption, and protection selectively for solid-state circuit breakers. In these types of low inductance short circuit events, it is desirable for a solid-state breaker to be able to detect short circuit faults and to also disregard noise and transients which can lead to nuisance tripping.

Based on the forgoing discussion, it therefore remains desirable to improve upon the operation and performance of solid-state circuit breakers, especially in DC distribution systems which present low inductances to potential short circuits.

BRIEF DESCRIPTION

In one aspect, a solid-state circuit breaker (SSCB) is provided. The SSCB comprises at least one solid-state switch, a current sense circuit, an analog fault detection circuit, and a controller. The at least one solid-state switch is configured to selectively enable and disable a current path through the SSCB based on at least one control signal. The current sense circuit is configured to sense a current through the current path and generate a first output representative of the current. The analog fault detection circuit is coupled with the first output and configured to assert a second output in response to the current through the current path exceeding a trip current level for the SSCB, where the analog fault detection circuit has a first di/dt detection bandwidth. The controller is coupled with the second output and is configured to (a) generate samples of the first output utilizing at least one analog-to-digital converter (ADC), where the at least one ADC has a second di/dt detection bandwidth that is less than the first di/dt detection bandwidth, (b) calculate the current through the current path based on the samples, and (c) determine whether the calculated current through the current path exceeds the trip current level for the SSCB. The controller is further configured to (d) disable the current path through the SSCB utilizing the at least one control signal in response to determining that the calculated current exceeds the trip current level for the SSCB. The controller is further configured to (e) concurrently with (a), (b), and (c), determine whether the second output is asserted, and (f) disable the current path through the SSCB utilizing the at least one control signal in response to determining that the second output is asserted.

In another aspect, a method of operating a SSCB is provided, where the SSCB includes an analog fault detection circuit having a first di/dt detection bandwidth, and at least one ADC having a second di/dt detection bandwidth that is less than the first di/dt detection bandwidth. Them method comprises (a) generating samples of a first output of a current sense circuit utilizing the at least one ADC, where the first output is representative of a current through a current path of the SSCB, (b) calculating the current through the current path based on the samples, (c) determining whether the calculated current through the current path exceeds a trip current level for the SSCB, and (d) disabling the current path through the SSCB in response to determining that the calculated current exceeds the trip current level for the SSCB. The method further comprises (e), concurrently with (a), (b), and (c), determining whether a second output of an analog fault detection circuit is asserted, where the analog fault detection circuit is configured to assert the second output in response to the current through the current path exceeding the trip current level for the SSCB. The method further comprises (f) disabling the current path through the SSCB in response to determining that the second output is asserted.

In another aspect, a SSCB is provided. The SSCB comprises at least one solid-state switch, a current sense circuit, an analog fault detection circuit, at least one ADC, and a controller. The at least one solid-state switch is configured to selectively enable and disable a current path through the SSCB based on at least one control signal. The current sense circuit is configured to sense a current through the current path and generate a first output representative of the current. The analog fault detection circuit is coupled with first output and is configured to assert a second output in response to the current through the current path exceeding a trip current level for the SSCB, where the analog fault detection circuit has a first di/dt detection bandwidth. The at least one ADC is configured to generate samples of the first output, where the ADC has a second di/dt detection bandwidth that is less than the first di/dt detection bandwidth. The controller is configured to disable the current path through the SSCB utilizing the at least one control signal in response to determining, asynchronously, that either the second output is being asserted by the analog fault detection circuit or the samples indicate that the current through the current path exceeds the trip current level for the SSCB.

DRAWINGS

These and other features, aspects, and advantages of the present disclosure will become better understood when the following detailed description is read with reference to the accompanying drawings in which like characters represent like parts throughout the drawings, wherein.

Figure 1:
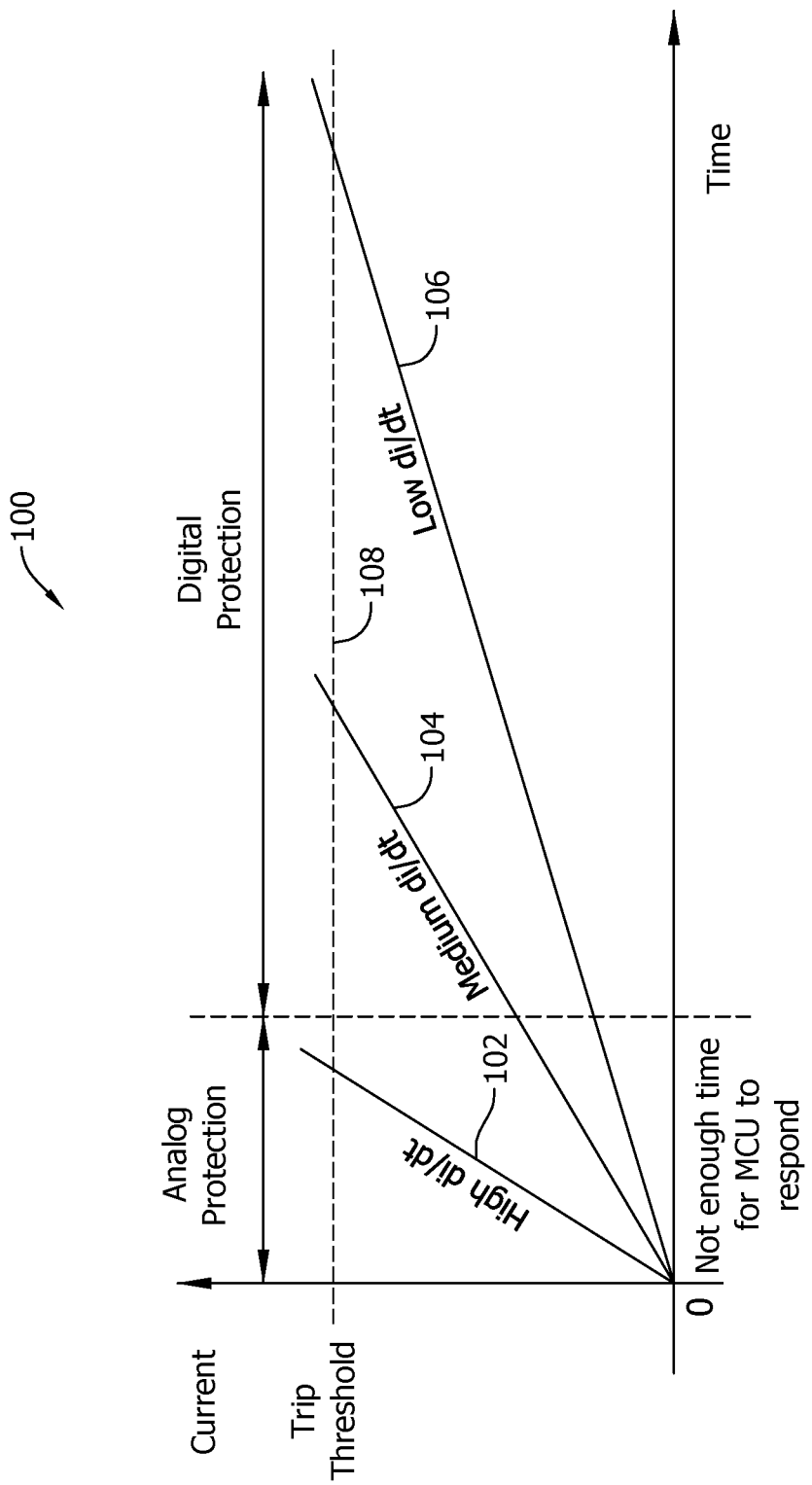
FIG. 1 depicts a graph of different di/dt fault waveforms in an exemplary embodiment.

Unless otherwise indicated, the drawings provided herein are meant to illustrate features of embodiments of this disclosure. These features are believed to be applicable in a wide variety of systems comprising one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, an analog computer, a programmable logic controller (PLC), an application specific integrated circuit (ASIC), and other programmable circuits, and these terms are used interchangeably herein. In the embodiments described herein, "memory" may include, but is not limited to, a computer-readable medium, such as a random-access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a touchscreen, a mouse, and a keyboard. Alternatively, other computer peripherals may also be used that may include, for example, but not be limited to, a scanner. Furthermore, in the example embodiment, additional output channels may include, but not be limited to, an operator interface monitor or heads-up display. Some embodiments involve the use of one or more electronic or computing devices. Such devices typically include a processor, processing device, or controller, such as a general-purpose central processing unit (CPU), a graphics processing unit (GPU), a microcontroller, a reduced instruction set computer (RISC) processor, an ASIC, a programmable logic controller (PLC), a field programmable gate array (FPGA), a digital signal processing (DSP) device, and/or any other circuit or processing device capable of executing the functions described herein. The methods described herein may be encoded as executable instructions embodied in a computer readable medium, including, without limitation, a storage device and/or a memory device. Such instructions, when executed by a processing device, cause the processing device to perform at least a portion of the methods described herein. The above examples are not intended to limit in any way the definition and/or meaning of the term processor and processing device.

As discussed previously, some DC distributions systems may present a low inductance to potential short circuits, which can result in high di/dt short circuit currents. When a solid-state circuit breaker utilizes software (e.g., executing on a microcontroller) to detect short circuit events, the delay associated with detecting and interrupting the short circuit current may be long enough that the short circuit current exceeds the current rating of the solid-state circuit breaker, which may damage or destroy the solid-state circuit breaker. While analog short circuit current detection circuits may provide a significantly faster response time in order to mitigate short circuit conditions, analog circuits are relatively inflexible with respect to implementing a short circuit detection and interruption strategy (e.g., variable trip thresholds), and further, analog circuits are prone to nuisance tripping due to noise or other transient conditions, which are undesirable.

Solid-state circuit breakers are used to protect distribution systems from different types of faults, including overloads, slow short circuit events, and high di/dt fault currents. Long time constant, low di/dt faults are caused by a high fault impedance, whereas short time constant, high di/dt faults are caused by a low fault impedance. Most of the fault impedance is defined either by the impedance at the source and/or the length of the cables or bus bar connections. Since the length of the cables in the upstream direction (from the source side) and the downstream direction (to the load side) is uncertain prior to installation of the solid-state circuit breaker, the fault impedance is therefore not fixed, but may reside within a range of fault impedance values. The solid-state circuit breaker is tasked with operating correctly within the range of fault impedance values. In some applications this range can be wide enough to introduce challenges in the design of the response time of the tripping unit of the solid-state circuit breaker.

FIG. 1 depicts a graph 100 of different di/dt fault waveforms in an exemplary embodiment. Graph 100 depicts a high di/dt fault waveform 102, a medium di/dt fault waveform 104, and a low di/dt fault waveform 106. Graph 100 also depicts a trip current threshold 108 where the solid-state circuit breaker should open and different categories of trip implementations that are needed to respond correctly to the particular di/dt fault waveform. In particular, high di/dt fault waveforms 102 generally occur so quickly that analog protection is generally needed, while medium di/dt fault waveforms 104 and low di/dt fault waveforms 106 generally occur slow enough that digital circuits, such as microcontrollers, are adequate to respond correctly.

In most cases the solid-state circuit breaker is tripped when the fault current reaches or crosses a certain predefined threshold value. However, different di/dt fault waveforms will take different times to reach this trip threshold. In the case of low di/dt fault waveform 106 this time could be of the order of hundreds of microseconds to several milliseconds, whereas, for high di/dt fault waveform 102 this time could be barely a few microseconds or even lower. This means that the fault detection circuit should be able to identify the fault over very short times as well as over longer times. Most solid-state device-based applications (converters, breakers, contactors) use a digital processing unit, including microcontrollers, programmable logic devices, digital signal processors, etc., for a main controller. The main controller takes care of a wide range of tasks such as analog to digital conversion, fault detection algorithms, miscellaneous control calculations, external communication interface, etc. Due to the non-fault related activities, ensuring that the main controller works on wide range of fault di/dt (especially high di/dt fault waveform 102) can be technically challenging as well as economically expensive. For example, to detect high di/dt fault waveform 102, an analog-to-digital converter (ADC) sampling time of a microcontroller may need well below a half microsecond as well as system clock speed of several hundreds of megahertz (MHz). Such requirements can make the solution more expensive as well as demand high processing bandwidth (to address high di/dt fault waveform 102), leaving little processing bandwidth remaining for other system functions.

Further, DC distribution system branches could be both loads and sources in some implementations. For example, when a DC distribution system branch is coupled to battery energy storage systems, buffer capacitors, and/or regenerative converters, the DC distribution system branch may operate as a load or as source at different times. In this case, it is desirable that the solid-state circuit breaker would trip with a different selectivity based on if it is acting as a source (upstream) or as a load (downstream). Selective thresholds for tripping the solid-state circuit breaker in different conditions and current directions are desirable to achieve a complete coordination and maximize survivability and/or availability for the DC distribution system.

Figure 2:
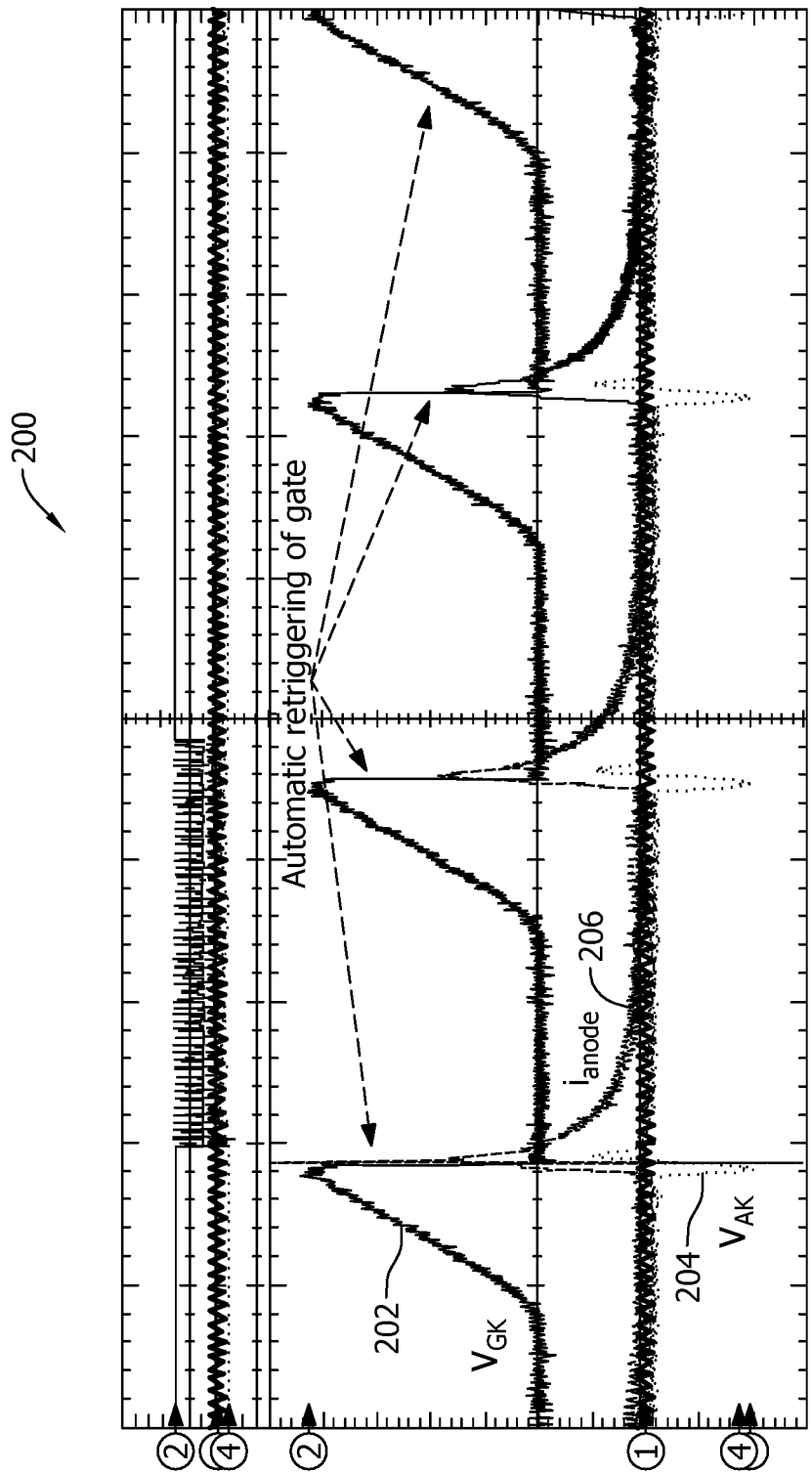
FIG. 2 depicts a gate re-triggering waveform of a reverse-blocking integrated gate commutated thyristor (RB-IGCT) in an exemplary embodiment.

Further still, reverse-blocking integrated gate commutated thyristors (RB-IGCT) based solid-state circuit breakers are a very promising technology for many DC distribution applications. However, the RB-IGCT, in its current solution, has certain performance limitations. For example, during an on state and under a reverse voltage across the anode-cathode of an RB-IGCT, the device conducts a small negative current of about five amps in steady state. Also, depending on the dv/dt of this reverse applied voltage, there could be a spike of current from about forty amps to about sixty amps. This behavior is registered by the gate driver circuit in the RB-IGCT, and as a safety feature, the gate driver circuit in certain devices turns off the RB-IGCT. However, after some time (some milliseconds later) the gate driver circuit retriggers the RB-IGCT again and the cycle repeats. This problem is illustrated in FIG. 2, which depicts a gate re-triggering waveform 200 of an RB-IGCT in an exemplary embodiment. FIG. 2 depicts the gate-to-cathode voltage 202, anode-to-cathode voltage 204, and anode current 206 of an RB-IGCT during retriggering. Moreover, this behavior depends on the magnitude and dv/dt of applied voltage, in that, the gate driver may or may not retrigger the device. This unpredictable and uncontrollable behavior of an RB-IGCT in the reverse blocking mode during the on state may cause undesired behavior in the system, such as a continuous negative leakage current in unidirectional breaker and may also cause overheating of the device depending on the cooling system design.

In the embodiments described herein, a mixed signal solution (analog+digital) is provided for the detection of high, medium, and low di/dt short circuit events, and the mixed signal solution also rejects noise and transients that may lead to nuisance tripping. An analog circuit selectively detects a high di/dt short circuit event in coordination with a software algorithm that selectively detects medium di/dt to low di/dt short circuit events, fault current direction, and provides tripping thresholds based on the current direction and overload conditions. The mixed signal solution detects the voltage polarity of the power semiconductors, during both on state as well as off state, for preventative control (for bi-directional breakers) and diode like control (in unidirectional breakers) of RB-IGCT based solid-state circuit breakers and other devices with similar characteristics. The mixed signal solution provides selective tripping current and current derivative thresholds based on the current direction and load side and source side faults, which are useful for branches that are both loads and sources (e.g., battery energy storage systems and regenerative converters). The mixed signal solution also provides programmable hardware for fault detection and voltage polarity detection circuits.

Figure 3:
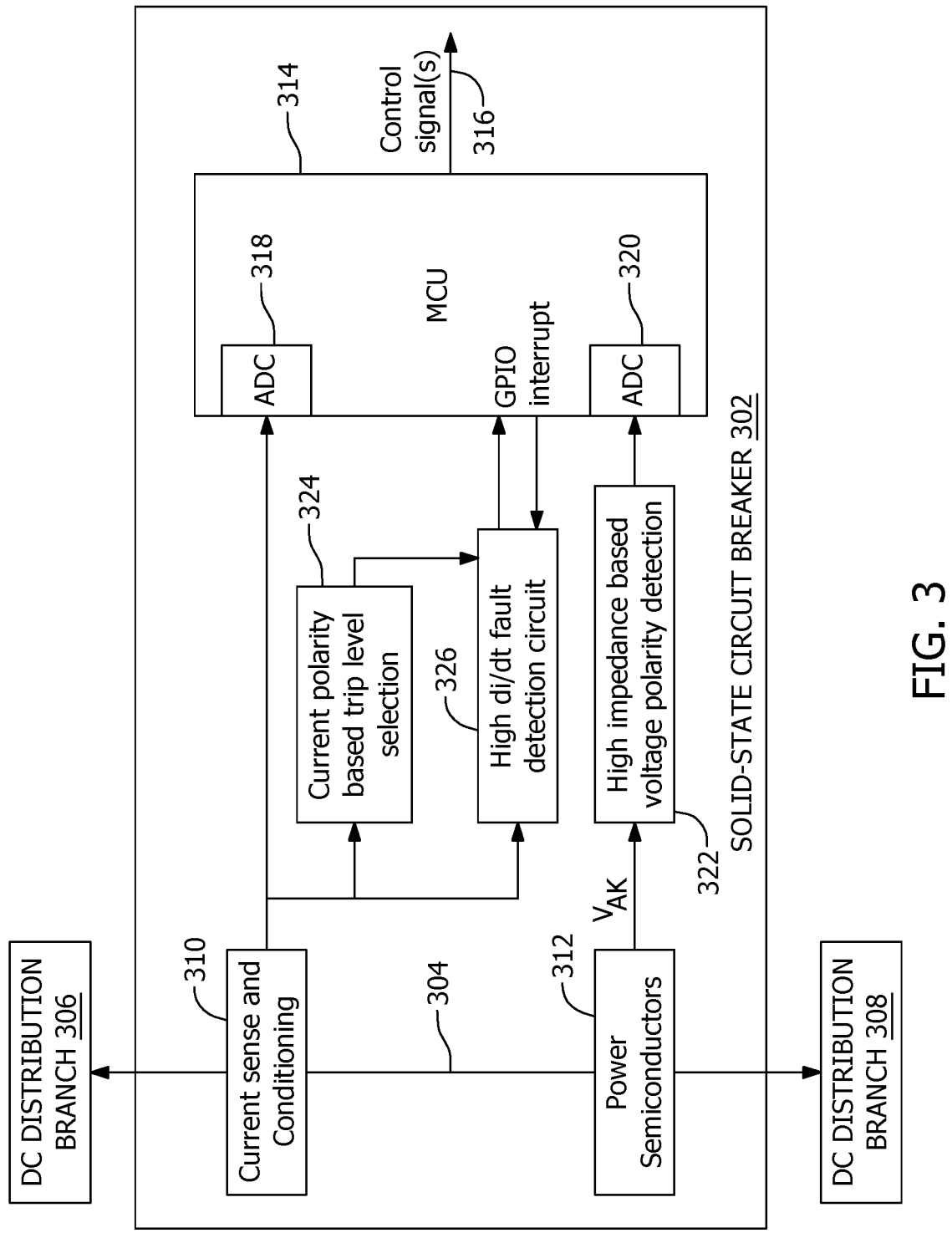
FIG. 3 depicts a block diagram of a sold-state circuit breaker in an exemplary embodiment.

FIG. 3 depicts a block diagram of a sold-state circuit breaker (SSCB) 302 in an exemplary embodiment. SSCB 302 comprises any component, system, or device which performs the functions described herein for SSCB 302. SSCB 302 will be described with respect to various discrete elements, which perform functions. These elements may be combined in different embodiments and/or segmented into different discrete elements in other embodiments.

In this embodiment, SSCB 302 selectively controls a current path 304 between different DC distribution branches 306, 308 of a power distribution system. DC distribution branches 306, 308 may be electrically coupled with sources, loads, or combinations of sources and loads. For example, DC distribution branches 306, 308 may be coupled to battery energy storage systems, which may switch between being a load (when charging the battery energy storage system) and being a source (when the battery energy storage system provides power to other DC distribution branches of the power distribution system.

In this embodiment, SSCB 302 comprises a current sense circuit 310 and power semiconductors 312 in current path 304. Current sense circuit 310 senses a current in current path 304. Current sense circuit 310 may sense the magnitude of the current in current path 304 and the direction of the current in current path 304, with the direction varying depending on whether DC distribution branches 306, 308 operate as loads or sources. Power semiconductors 312 selectively control whether current flows in current path 304. Power semiconductors 312 may comprise RB-IGCT devices, asymmetric IGCT devices, silicon carbide (SiSiC) insulated-gate bipolar transistor (IGBT) devices, SiSiC metal-oxide-semiconductor field-effect transistor (MOSFET) devices, silicon carbide (SiC) junction-gate field-effect transistor (JFET) devices, SiC field-effect transistors (FET) devices, or other types of solid-state switches (and combinations thereof) in various embodiments. In this embodiment, a microcontroller unit (MCU) 314 provides control signal(s) 316 which control the operation of power semiconductors 312. In this embodiment, MCU 314 includes analog-to-digital converters (ADCs) 318, 320, although in other embodiments, ADCs 318, 320 are separate from MCU 314.

The output of current sense circuit 310 (i.e., a first output) is provided to ADC 318 of MCU 314. In some embodiments, control signal(s) 316 are used to directly control the gate (or the equivalent terminal) of power semiconductors 312 via the appropriate voltage and/or current bias transmitted over a communication channel. In various embodiments, the communication channel is electrical, optical, electromagnetic, and/or combinations thereof. In other embodiments, control signal(s) 316 are used to transmit commands to a driver and/or controller of power semiconductors 412 in order to control the conduction state of power semiconductors 412.

In this embodiment, SSCB 302 further comprises a voltage polarity detection circuit 322, a trip level selector 324, and a high di/dt fault detection circuit 326. Voltage polarity detection circuit 322 measures the voltage across power semiconductors 312. The output of voltage polarity detection circuit 322 is provided to ADC 320 of MCU 314. Trip level selector 324 is used to modify the trip level based on the direction of the current flowing through current path 304.

In this embodiment, the output of current sense circuit 310 is provided to both analog circuits (i.e., trip level selector 324 and high di/dt fault detection circuit 326) and digital circuits (i.e., ADC 318 of MCU 314) in order to discriminate different types of fault events. The detected faults include high di/dt fault waveform 102, medium di/dt fault waveform 104, and low di/dt fault waveform 106 (see FIG. 1.). The detected faults further include faults towards both sources and loads. Further, the output of voltage polarity detection circuit 322 is processed by MCU 314 to identify the polarity across power semiconductors 312, which is used to determine and/or predict the direction of current flow through current path 304. In some embodiments, trip level selector 324 may be implemented as an analog circuit, a digital circuit, or a combination of analog and digital circuits. For example, trip level selector 324 may be implemented using programmable logic devices, high-speed ADC's, microcontrollers, or combinations thereof.

In this embodiment, high di/dt fault detection circuit 326 is a high-speed analog circuit that generates a second output that may trigger an interrupt at MCU 314 when a high di/dt fault current is detected. High di/dt fault detection circuit has a high di/dt detection bandwidth (e.g., high di/dt fault detection circuit 326 has a high cut-off frequency response, which allows high di/dt fault detection circuit 326 to respond to high di/dt fault currents).

Using interrupts, MCU 314 can operate quickly to disable current path 304 through SSCB 302 using control signal(s) 316, which are applied to power semiconductors 312. Medium di/dt faults and low di/dt faults are detected by measuring the current in current path 304 using current sense circuit 310 and ADC 318, with voltage polarity detection circuit 322 providing the polarity across power semiconductors 312 to MCU 314. MCU 314 operates on this information to selectively control the conduction state of power semiconductor 312 to disable current path 304 utilizing control signal(s) 316 when a trip current level is reached. ADC 318 has a lower di/dt detection bandwidth than high di/dt fault detection circuit 326 (e.g., ADC 318 has a lower cut-off frequency response than high di/dt fault detection circuit 326). The use of a relatively low-bandwidth implementation for ADC 318 reduces the costs associated with implementing the detection of di/dt faults over a large range of values.

Figure 4:
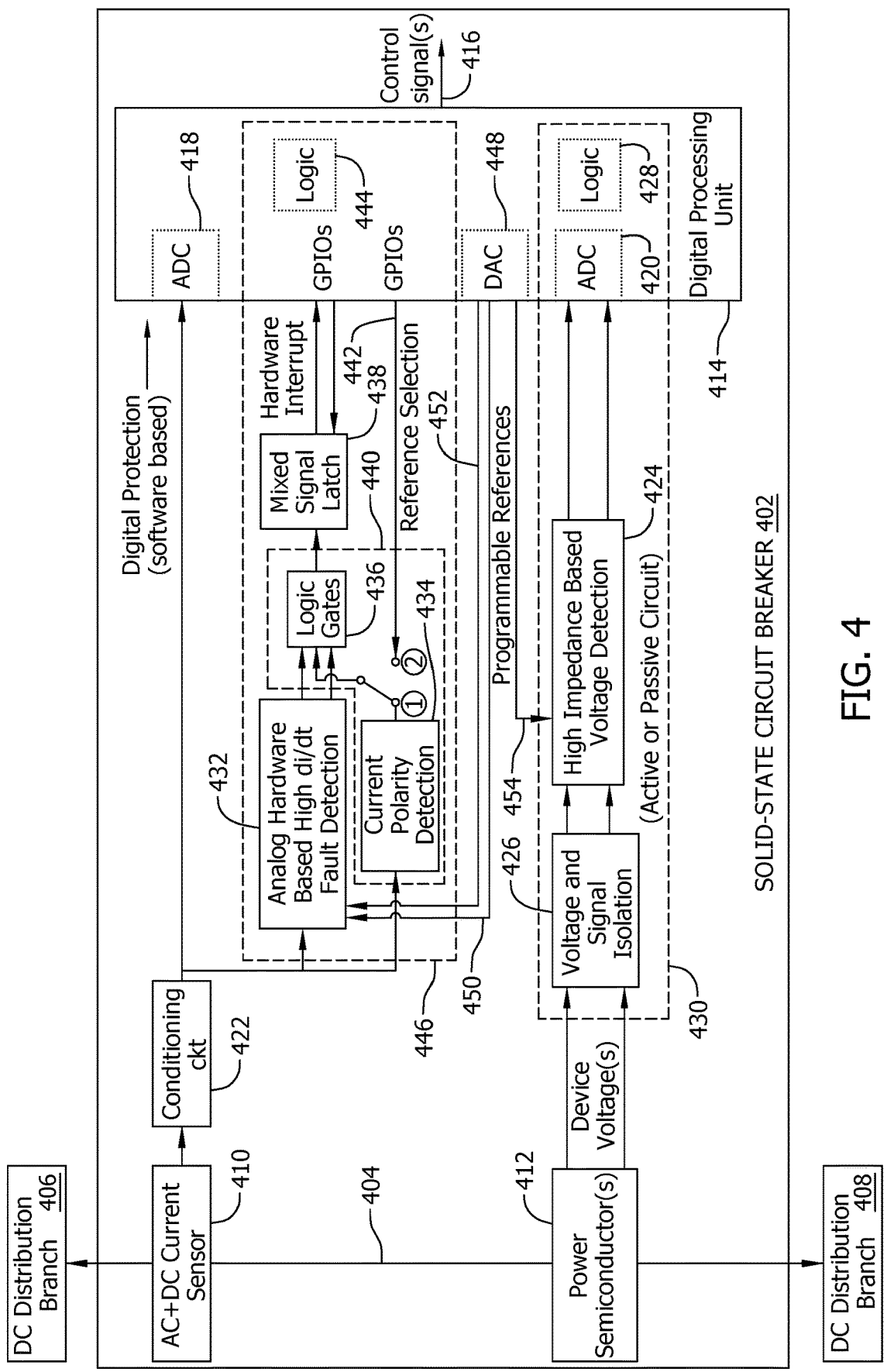
FIG. 4 depicts a block diagram of another solid-state circuit breaker in an exemplary embodiment.

FIG. 4 is a block diagram of another SSCB 402 in an exemplary embodiment. SSCB 402 comprises any component, system, or device which performs the functions described herein for SSCB 402. SSCB 402 will be described with respect to various discrete elements, which perform functions. These elements may be combined in different embodiments and/or segmented into different discrete elements in other embodiments.

In this embodiment, SSCB 402 selectively controls a current path 404 between different DC distribution branches 406, 408 of a power distribution system. DC distribution branches 406, 408 may be electrically coupled to sources, loads, or combinations of sources and loads. For example, DC distribution branches 406, 408 may be electrically coupled to battery energy storage systems, which may switch between being a load (when charging the battery energy storage system) and being a source (when the battery energy storage system provides power to the power distribution system.

In this embodiment, SSCB 402 comprises a current sense circuit 410 and power semiconductors 412 in current path 404. Current sense circuit 410 senses a current in current path 404. Current sense circuit 410 may sense the magnitude of the current in current path 404 and the direction of the current in current path 404, with the direction of the current in current path 404 varying based on whether DC distribution branches 406, 408 operate as loads or sources. Power semiconductors 412 selectively control whether current flows in current path 404. Power semiconductors 412 may comprise RB-IGCT devices or other types of solid-state switches in various embodiments, similar to those discussed with respect to power semiconductors 312 of FIG. 3.

In this embodiment, a digital processing unit (DPU) 414 provides control signal(s) 416 which control the operation of power semiconductors 412. DPU 414 may include programmable logic devices, microcontrollers, digital signal processors, or combinations thereof. In this embodiment, DPU 414 includes analog-to-digital converters (ADCs) 418, 420, although in other embodiments, ADCs 418, 420 are separate from DPU 414. The output of current sense circuit 410 is provided to a conditioning circuit 422, which is then provided to ADC 418 of DPU 414. Conditioning circuit 422 may, for example, provide noise filtering, signal clamping, signal clipping, polarity rectification, and/or signal scaling to the signal(s) output by current sense circuit 410. Collectively, current sense circuit 410 and conditioning circuit 422 may correspond to current sense circuit 310 of FIG. 3.

In this embodiment, SSCB 402 further comprises a voltage polarity detection circuit 424 and a voltage and signal isolation circuit 426. Voltage polarity detection circuit 424 measures the voltage across power semiconductors 412, and a voltage and signal isolation circuit 426 that provides isolation of the voltages read from power semiconductors 412. Voltage and signal isolation circuit 426 provides isolation between the high voltages across power semiconductors 412 (when power semiconductors 412 are in the off state) and the low-voltage circuits of SSCB 402.

The output of voltage polarity detection circuit 424 is provided to ADC 420 of DPU 414, and DPU 414 implements logic 428 that controls the operation of SSCB 402 based, at least in part, on the voltage polarity across power semiconductors 412 and/or the voltage across power semiconductors 412. Collectively, voltage and signal isolation circuit 426, voltage polarity detection circuit 424, ADC 420, and logic 428 implement a control block 430 for SSCB 402 that provides mixed signal based voltage polarity detection, preventative control, and diode-like operation for SSCB 402.

In this embodiment, the output of conditioning circuit 422 is provided to both analog circuits (i.e., a high di/dt fault detection circuit 432) and digital circuits (i.e., ADC 418 of DPU 414) in order to discriminate different types of fault events. The detected faults include high di/dt fault waveform 102, medium di/dt fault waveform 104, and low di/dt fault waveform 106 (see FIG. 1.). The detected faults further include faults towards both sources and loads.

In this embodiment, high di/dt fault detection circuit 432 is a high-speed analog circuit, and its output is provided to logic gates 436. High di/dt fault detection circuit 432 has a high di/dt detection bandwidth (e.g., high di/dt fault detection circuit 432 has a high cut-off frequency response, which allows high di/dt fault detection circuit 432 to respond to high di/dt fault currents). ADC 418 has a lower di/dt detection bandwidth than high di/dt fault detection circuit 432 (e.g., ADC 418 has a lower cut-off frequency response than high di/dt fault detection circuit 432). The use of a relatively low-bandwidth implementation for ADC 418 reduces the costs associated with implementing the detection of di/dt faults over a large range of values.

The output of logic gates 436 is provided to a mixed signal latch 438. Logic gates 436 may implement various functions, including converting the output of high di/dt fault detection circuit 432 into a digital format for DPU 414, latching the output of high di/dt fault detection circuit 432 until a secondary condition is met (e.g., DPU 414 clears the latched state of logic gates 436), performing logic inversion, multiplexing, etc., of the output of high di/dt fault detection circuit 432.

The output of mixed signal latch may selectively generate a hardware interrupt at DPU 414. The sequence analog and digital logic in this control path triggers an interrupt at DPU 414 when a high di/dt fault current (e.g., high di/dt fault waveform 102) is detected. Using interrupts, DPU 414 operates quickly to disable current path 404 through SSCB 402 by modifying control signal(s) 416 for power semiconductors 412. Medium di/dt faults (e.g., medium di/dt fault waveform 104) and low di/dt faults (e.g., low di/dt fault waveform 106) are detected by measuring the current in current path 404 using current sense circuit 410, conditioning circuit 422, and ADC 418. DPU 414 operates, at least in part, on this information to selectively disable current path 304 utilizing control signal(s) 316 that control a conduction state of power semiconductors 412 when a trip current level is reached.

In this embodiment, a current polarity detector 434 and logic gates 436 collectively form a control block 440 that implements a threshold selection for both positive and negative fault currents at SSCB 402. This functionality is partially implemented by a reference selection signal 442 generated by DPU 414. Reference selection signal 442 modifies the trip current threshold that causes an interrupt to be generated at DPU 414 when high di/dt faults occur, based on the direction of the current in current path 404. Collectively, the elements of control block 440 may implement the functionality previously described with respect to trip level selector 324 (see FIG. 3).

In this embodiment, high di/dt fault detection circuit 432, control block 440, mixed signal latch 438, and logic 444 collectively form a control block 446 that implements a mixed signal based high di/dt fault protection system for SSCB 402. Logic is implemented by DPU 414 to both implement and modify how the high di/dt fault protection system operates. Further, a digital-to-analog converter (DAC) 448 of DPU 414 generates programmable references 450, 452, 454, which modify the operation of both high di/dt fault detection circuit 432 and voltage polarity detection circuit 424. In particular, programmable references 450, 452 modify the trip thresholds for high di/dt fault detection circuit 432 based on the current direction. Programmable reference 454 may be used to modify a threshold for voltage polarity detection circuit 424. During an on state (i.e., conducting), power semiconductors 412 may have a voltage drop of a few volts (e.g., zero to five volts) depending on the current and di/dt of the current. In an off state (i.e., non-conducting), power semiconductors 412 would have a voltage about equal to the system voltage (e.g., four hundred volts to about two thousand volts). The threshold may be decided based on the type of power semiconductors 412. For example, RB-IGCT devices the threshold may be about five volts to have a sufficient margin above the on state voltage, whereas IGBT or MOSFET type power semiconductors 412 the threshold may be about ten volts.

In one embodiment, high di/dt fault detection circuit 432 is used to differentiate instantaneous current of SSCB 402 flowing through current path 404. The derivative of current (di/dt) results in a proportional signal voltage level. The proportional signal voltage level is then used to generate a modified voltage reference for purpose of comparison. The modified voltage reference in turn changes the fault detection time based on the magnitude of the fault di/dt. Correct tuning of this differentiator and the modified voltage reference is used to ensure safe tripping of SSCB 402 even at very high di/dt, while also ensuring that there is no false tripping during fast load transients. As an example of the response of high di/dt fault detection circuit 432 to different fault current di/dt values, for a very high di/dt fault current, a fault signal would be generated within few hundred nanoseconds. For a lower di/dt fault current, it could take several microseconds or longer to generate the fault signal. This automatic time delay generation is used to ensure safe turn-off of power semiconductors 412 during a fault. The reference can be tuned programmable references 450, 452. Mixed signal latch 438 ensures that once the fault signal is created it stays latched until DPU 414, or an end user, resets mixed signal latch 438.

Figure 5:
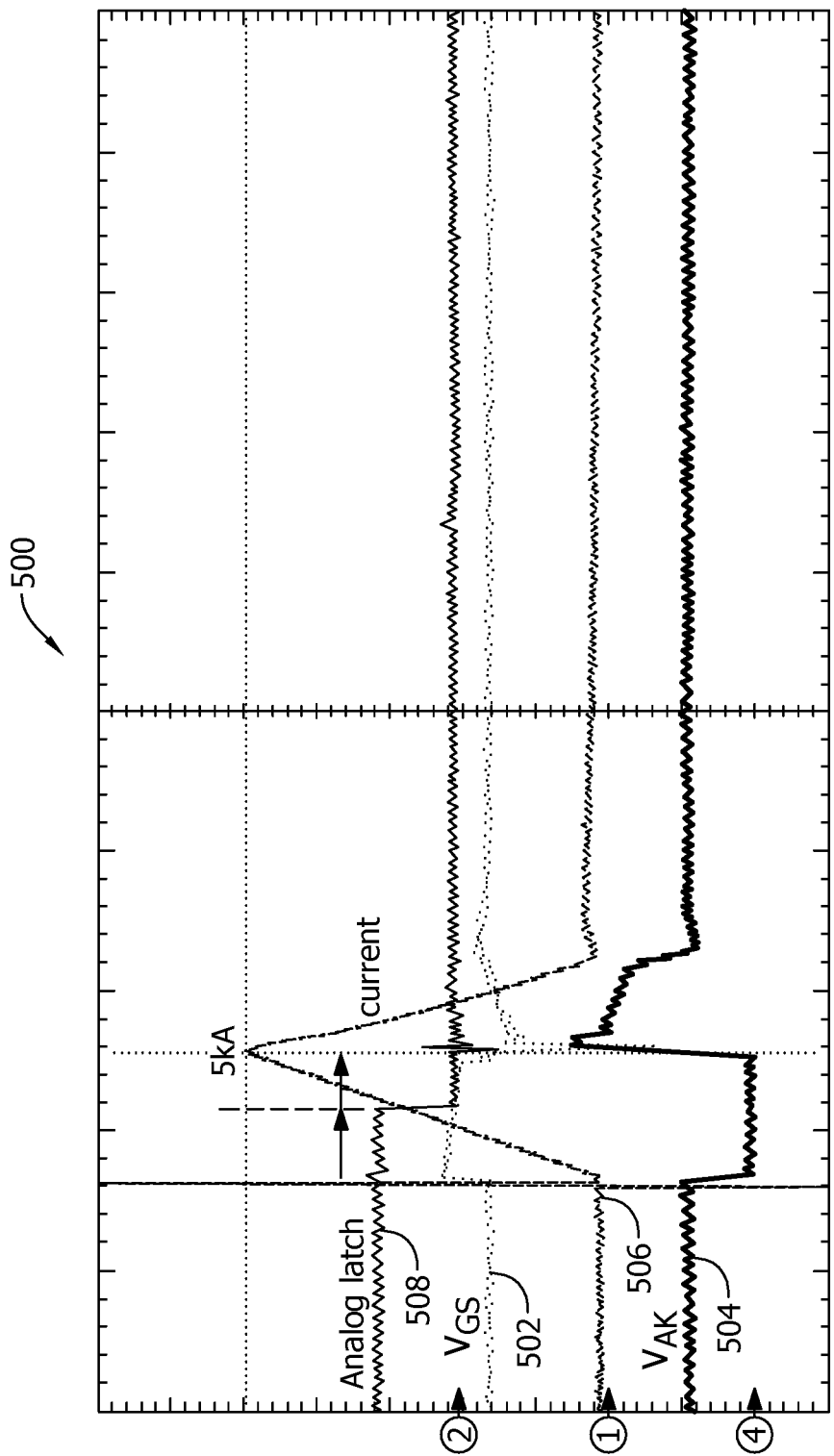
FIG. 5 depicts an experimental test waveform in an exemplary embodiment.

An example experimental test waveform 500 of this solution is depicted in FIG. 5, for protection during fault di/dt of about five hundred and twenty amps per microsecond at a nine hundred volts DC system voltage. FIG. 5 depicts a VGS 502, corresponding to control signal(s) 416, anode-to-cathode voltage 504, anode current 506, for an RB-IGCT based power semiconductor 412 during the fault protection. FIG. 5 also illustrates an output 508 of mixed signal latch 438. As shown in FIG. 5, after the fault has occurred, it takes about four microseconds to generate and latch the fault signal and another four microseconds to turn-off power semiconductors 412.

Figure 6:
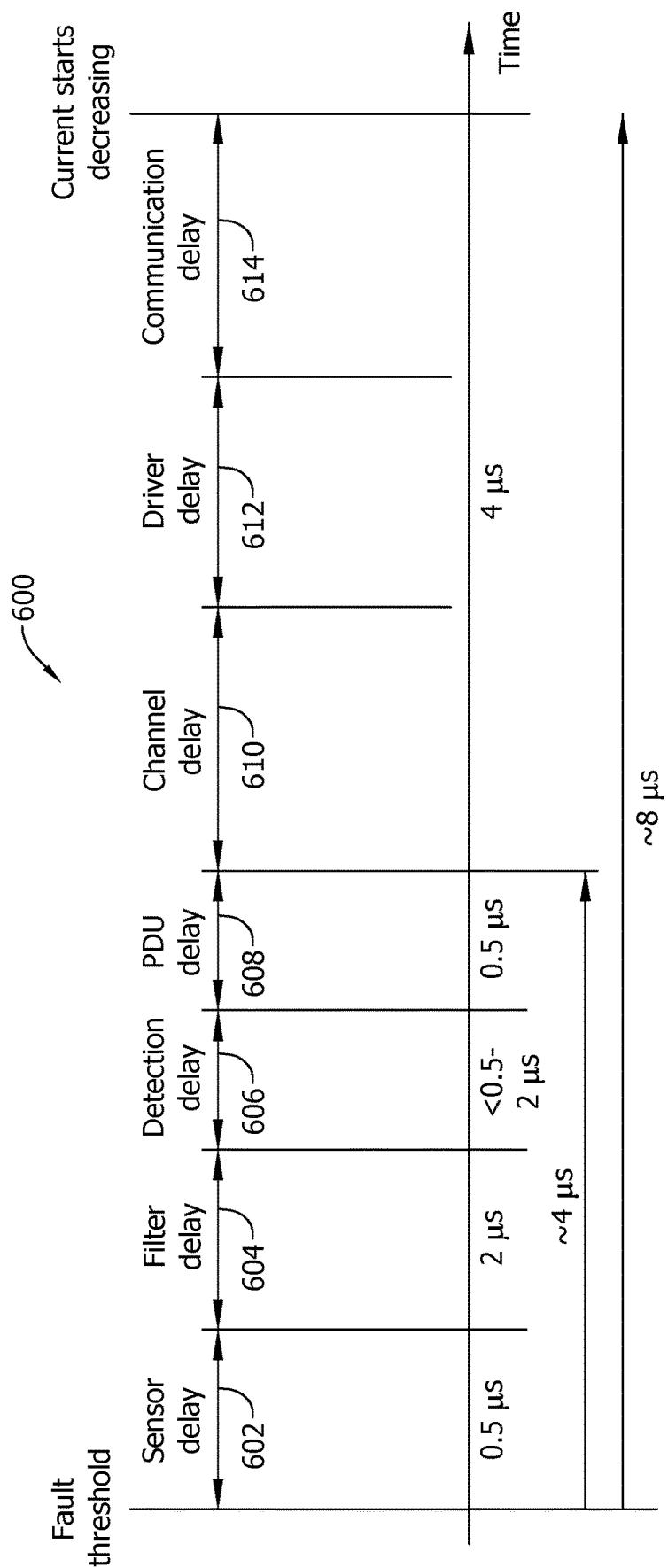
FIG. 6 depicts a timing delay distribution of different analog and digital components in an exemplary embodiment.

FIG. 6 depicts a timing delay distribution 600 of different analog and digital components for this implementation in an exemplary embodiment. FIG. 6 illustrates that the total delay from when a fault threshold is reached before current starts decreasing in power semiconductors 412 is about eight microseconds. This delay includes a sensor delay 602, associated with the response time of current sense circuit 410, a filter delay 604, associated with a propagation delay through conditioning circuit 422, a detection delay 606, associated with detecting the fault at high di/dt fault detection circuit 432 and propagating the detection signal through logic gates 436 and mixed signal latch 438, and a DPU delay 608, associated with the delay at DPU 414 for processing an interrupt generated by mixed signal latch 438 and asserting control signal(s) 416. The total delay is further generated by a channel delay 610, which is the delay associated with propagating control signal(s) 416 from DPU 414 to power semiconductors 412, a driver delay 612, associated with the delay at a driver of power semiconductors 412 before the driver modifies the conduction of power semiconductors 412 based on control signal(s) 416, and a commutation delay 614 associated with the time delay before power semiconductors 412 begin reducing the current through current path 404 when commanded to do so by the driver circuit.

Figure 7:
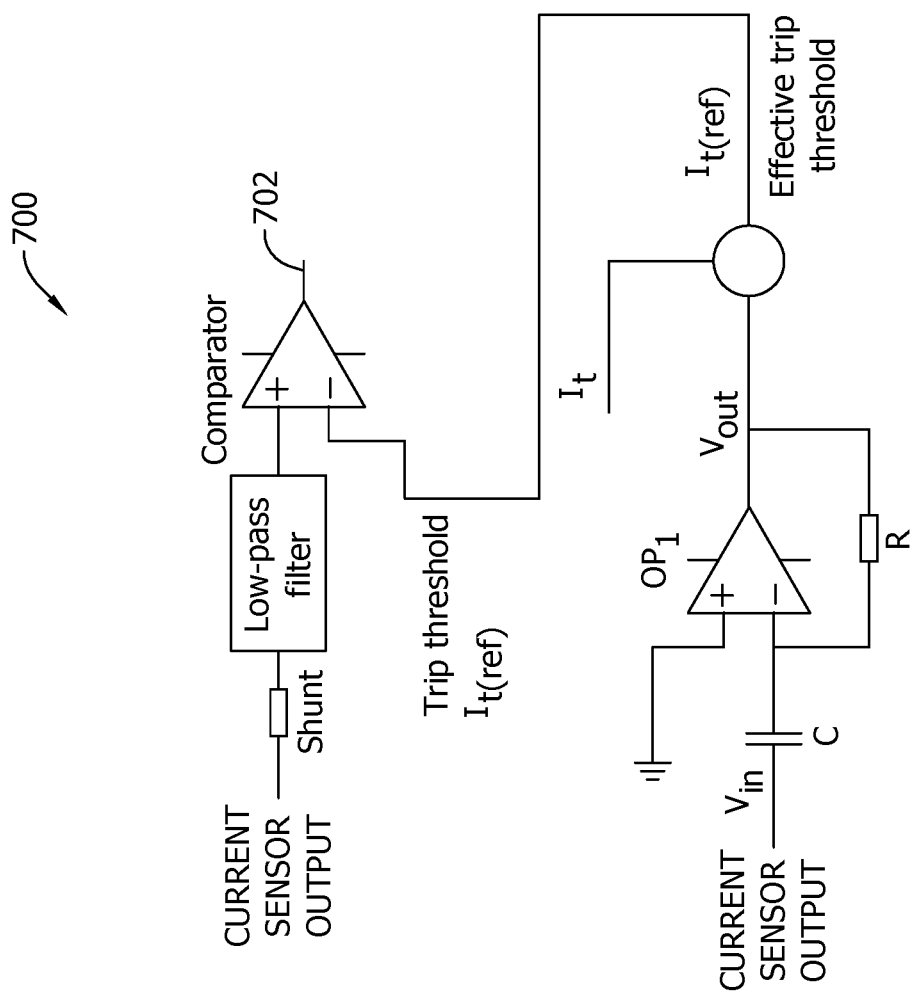
FIG. 7 depicts a circuit diagram of an analog circuit for detection of high di/dt current faults in an exemplary embodiment.

FIG. 7 depicts a circuit diagram 700 of an analog circuit for detection of high di/dt current faults in an exemplary embodiment. If SSCB 402 initiates the trip at a threshold $I_t$, the fault di/dt is y, and the control delay is d, SSCB 402 will interrupt the fault as eq (1): $I_{peak}=I_t+y*d$. The delays in the analog fault sensing circuit introduce an error $y*d$ in the peak fault current. This error needs to be compensated to ensure that the SSCB trips at the same peak fault current level irrespective of the magnitude of the fault-di/dt. The eq for variable (di/dt dependent) threshold is given by eq (2) $I_{t(ref)}=I_t-k*y_{est}$, where $k=R*C$, and where k is a tunable constant and $y_{est}$ is the estimated fault-di/dt. Output 702 of the comparator may be provided to logic gates 436, and is asserted when a high di/dt fault is detected.

Referring again to FIG. 4, control block 440, which implements a threshold selection for positive and negative fault currents, allows selection of the trip threshold based on the direction of the fault current through current path 404. High di/dt fault detection circuit 432, in an embodiment, responds to the magnitude of the di/dt, independent of the direction of the current. The output of high di/dt fault detection circuit 432 can be used to modify two independent trip reference signals corresponding to each direction of fault current. These reference signals can be set through programmable references 450, 452. The sensed fault current is compared with each of these modified reference signals to generate two trip signals. These signals are then gated by logic gates 436 to pass either of the trip signals to mixed signal latch 438 to generate the fault signal at DPU 414. In FIG. 4, two selection signals are shown, and identified as one and two. The selection signal marked as two comes from a I/O pin of DPU 414. If power semiconductors 412 for only one direction of conduction through current path 404 are enabled at any instant, control signal(s) 416 contain the information regarding the direction of conduction. Hence, these can be directly used to select the active reference for fault tripping. However, if power semiconductors 412 for both directions of conduction through current path 404 are enabled, the selection signal should be based on the current signal measured by ADC 418. The selection signal marked as one is generated by current polarity detector 434, which determines the direction of conduction through current path 404 based on the current measurement generated by the output of conditioning circuit 422. This process is more direct and does not depend on the a gating strategy (i.e., which of power semiconductors 412 are on and which are off implemented in some embodiments based on the direction of the current) used for SSCB 402.

However, using the selection signal marked as one is more prone to noise than using the selection signal marked as two. Hence, care must be taken to ensure adequate noise margins are incorporated in the design of current polarity detector 434. Also, it must be ensured that the delay through current polarity detector 434 does not exceed the time taken for high di/dt fault detection circuit 432 to generate the trip signal. Otherwise, the use of selection signal one may add delays to the fault detection time which can hamper the tripping speed for high di/dt faults.

Figure 8:
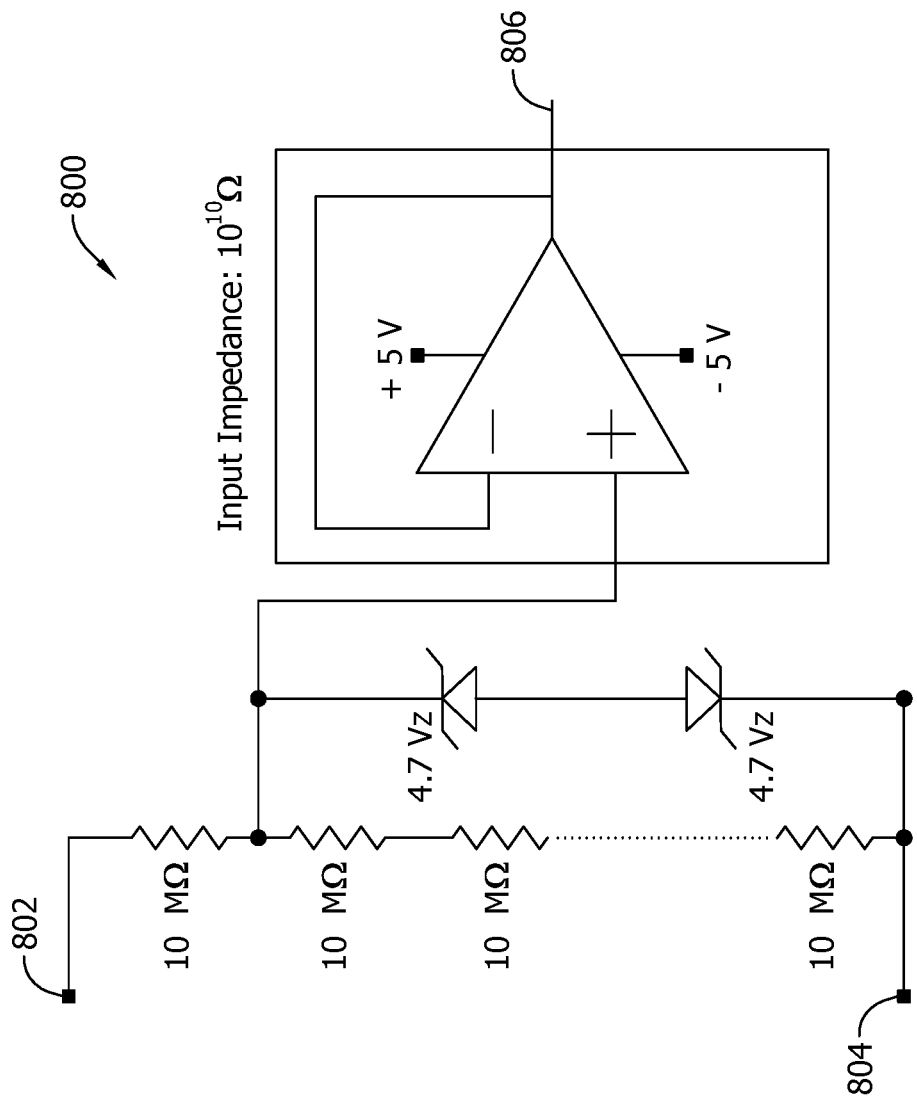
FIG. 8 depicts a voltage measurement circuit in an exemplary embodiment.

Control block 430, which implements mixed signal based voltage polarity detection, preventative control, and diode-like operation for power semiconductors 412, provides voltage measurements of power semiconductors 412 during both on state and off state. FIG. 8 depicts a voltage measurement circuit 800 in an exemplary embodiment. Voltage measurement circuit 800 accurately measures on state voltage (on the order of +/− one volt) as well as detects if the voltage is higher than certain threshold. The voltage measurement across terminals 802, 804 sensed by voltage measurement circuit 800 is isolated and provided to ADC 420 of DPU 414 (e.g., via output 806) so that logic 428 can monitor the voltage polarity and take appropriate action.

In some embodiments, DPU 414 implements a number of actions that are based on the voltage polarity of power semiconductors 412. One action is the preventative turn on of anti-parallel connected power semiconductors 412 when SSCB 402 is a bidirectional breaker. In particular, only one of power semiconductors 412 (in the correct conduction direction) may be turned on at a time. This guarantees the natural protection if there is a fault induced in the direction opposite to the flow of current. If both anti-parallel power semiconductors 412 are kept on all the time, then as soon as the above-mentioned fault occurs, power semiconductor 412 that was previously not conducting would start conducting a fault current. This could be problematic if the fault di/dt is very high, since there may not be enough time to correctly turn off the anti-parallel power semiconductors 412. Without the correct turn off procedure there may be a circulating current within anti-parallel power semiconductors 412, which may impact the reliability of SSCB 402.

Figure 9:
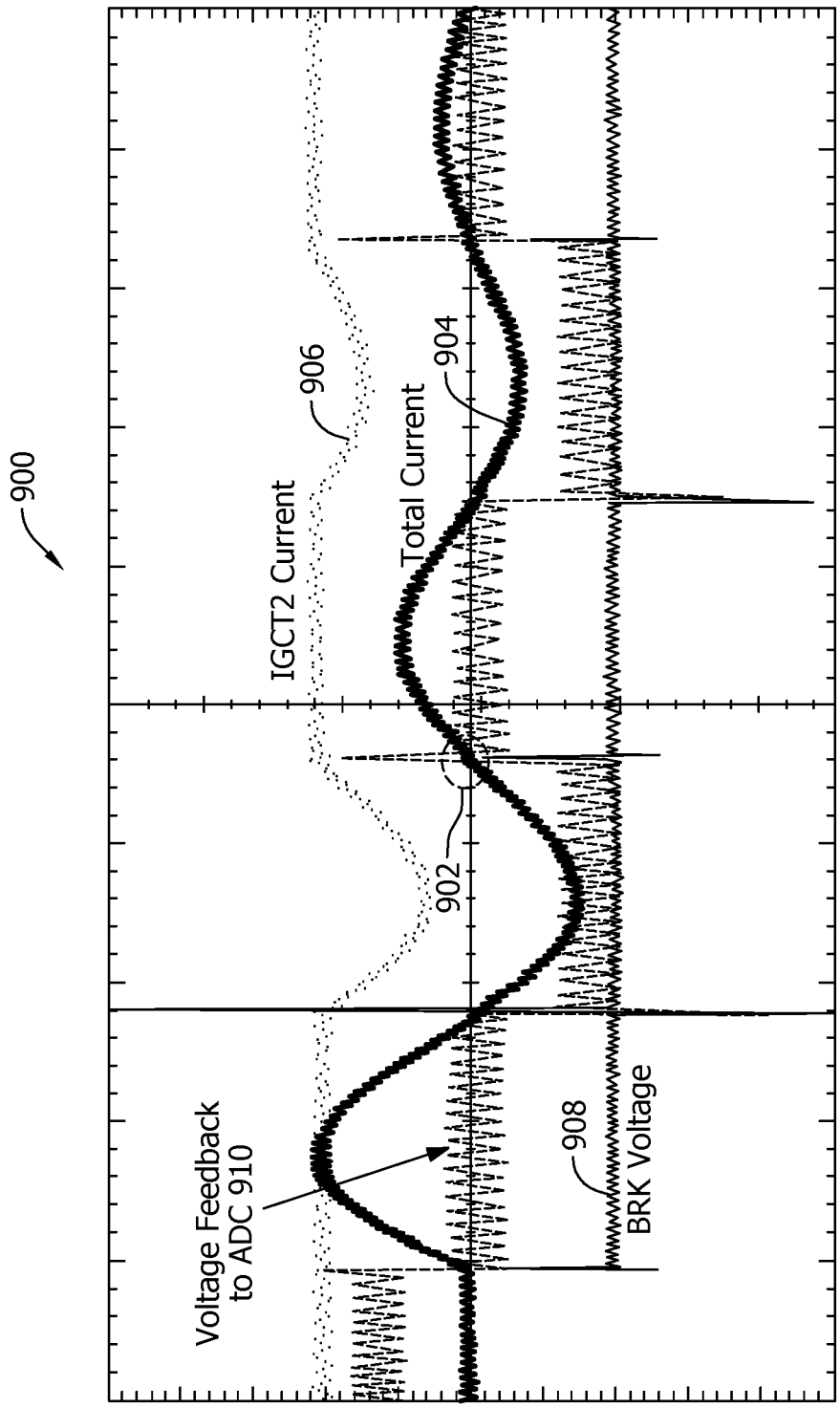
FIG. 9 depicts a graph showing an experimental result for preventative control based on voltage polarity detection in an exemplary embodiment.
Figure 10:
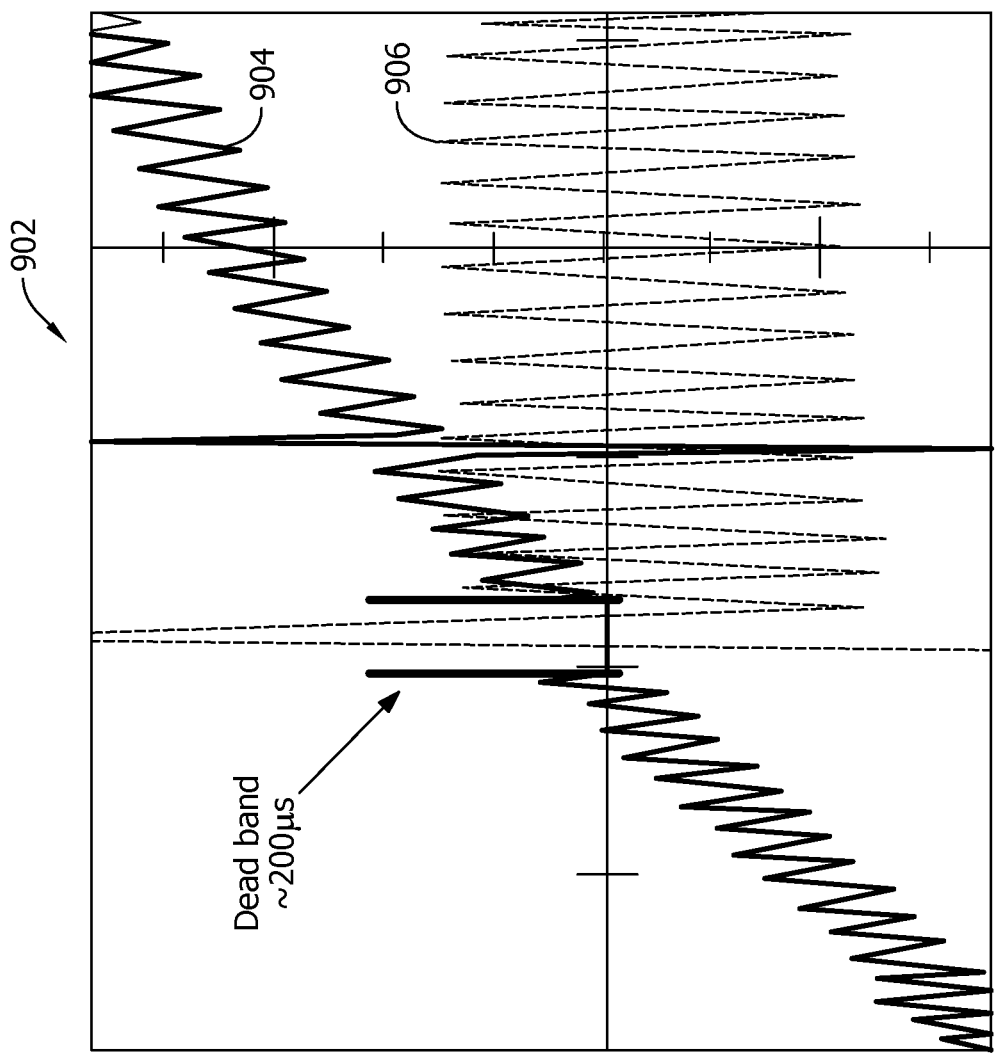
FIG. 10 depicts a region of the graph in FIG. 9 in an exemplary embodiment.

The voltage polarity detection solution provided by control block 430 helps indirectly to identify the polarity of current by sensing the polarity of the voltage across SSCB 402. The software executing on DPU 414 may then turn on the correct power semiconductor 412 to allow the flow of current in the conduction direction. During a power or current reversal, as soon as the voltage across SSCB 402 reverses and the current becomes zero, the current stays zero until the DPU 414 detects the reversal in polarity and turns on the other power semiconductor 412. In some cases, this may create a small dead-band (tens of microseconds or higher) in the current waveform. FIG. 9 depicts a graph 900 showing an experimental result for preventive control based on voltage polarity detection in an exemplary embodiment, and FIG. 10 depicts a region 902 of graph 900. FIG. 9 illustrates a total current 904 through power semiconductors 412, a current 906 through one of power semiconductors 412, a voltage 908 across SSCB 402, and a voltage 910 at ADC 420. FIG. 10 illustrates region 902, which depicts about a two hundred microsecond dead band when switching the active power semiconductor device 412 at a zero-crossing current.

Another action that DPU 414 may implement based on the voltage polarity of power semiconductors 412 includes operating SSCB 402 similar to a diode when SSCB 402 is a unidirectional breaker. A unidirectional breaker is tasked with blocking voltage in both direction and allowing the flow of current in only one direction. This can be achieved by an anti-series configuration for power semiconductors 412. But, when power semiconductors comprise RB-IGCT devices, one RB-IGCT may be used to achieve this functionality due to reverse blocking capability of RB-IGCTs. However, RB-IGCT's exhibit negative leakage current during their on-state when under reverse voltage. This leakage current may flow continuously and may create overheating of the RB-IGCT, along with other problems.

Figure 11:
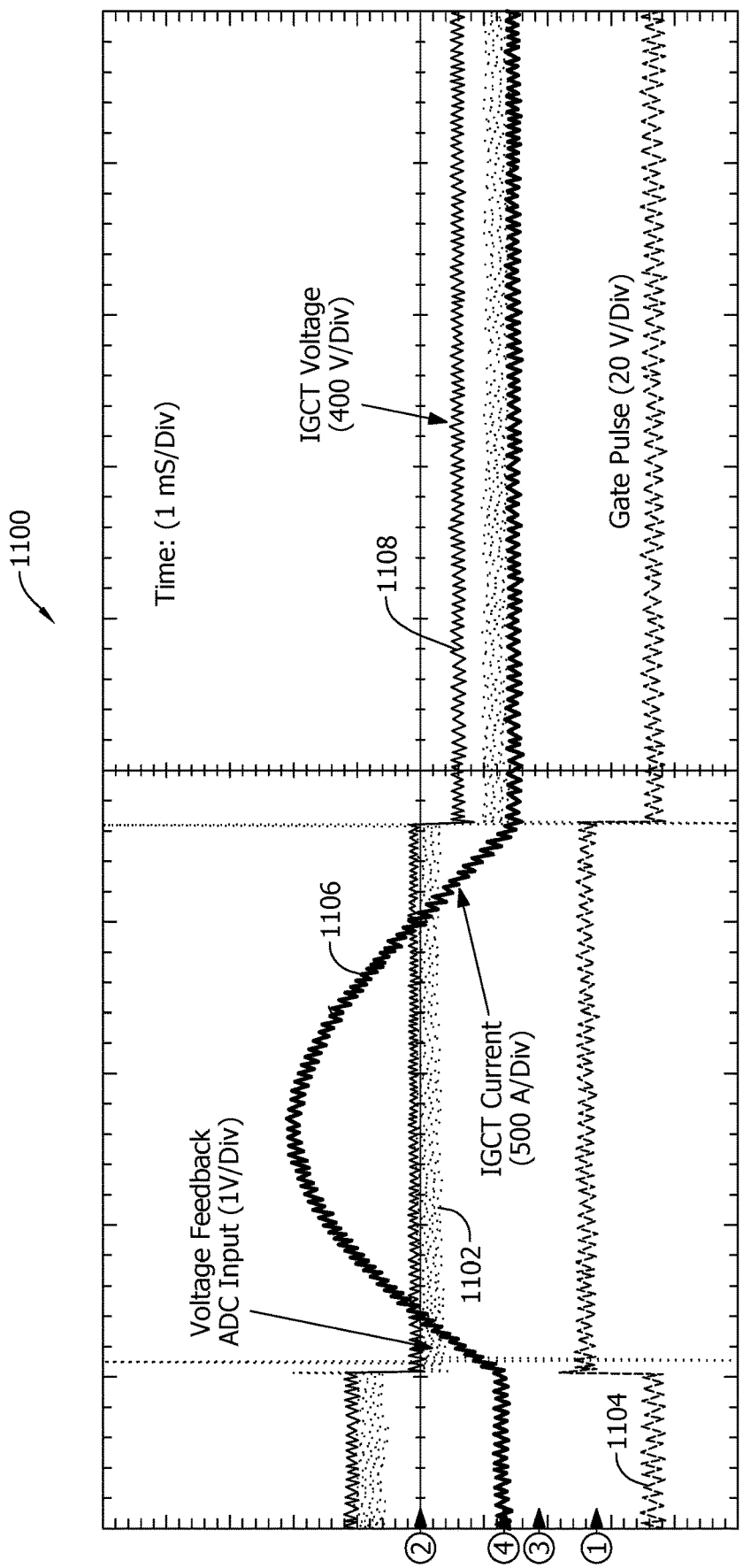
FIG. 11 depicts a graph illustrating diode like behavior when a SSCB is configured as a unidirectional breaker using RB-IGCTs in an exemplary embodiment.

The voltage polarity detection solution provided by control block 430 detects polarity reversal, and DPU 414 turns off the RB-IGCT. Once turned off, DPU 414 monitors the polarity utilizing ADC 420 to check if the voltage polarity across power semiconductors 412 has become positive. If a positive polarity is detected, then the RB-IGCT is turned on again. This allows a diode like behavior to be implemented in a unidirectional version of SSCB 402 using an RB-IGCT. FIG. 11 is a graph 1100 illustrating diode like behavior when SSCB 402 is configured as a unidirectional breaker using an RB-IGCT for power semiconductor 412 in an exemplary embodiment. Graph 1100 illustrates an ADC input voltage 1102 to ADC 420, a gate control signal 1104 for the RB-IGCT, a current 1106 conducted by the RB-IGCT, and a voltage 1108 across the RB-IGCT.

Figure 12:
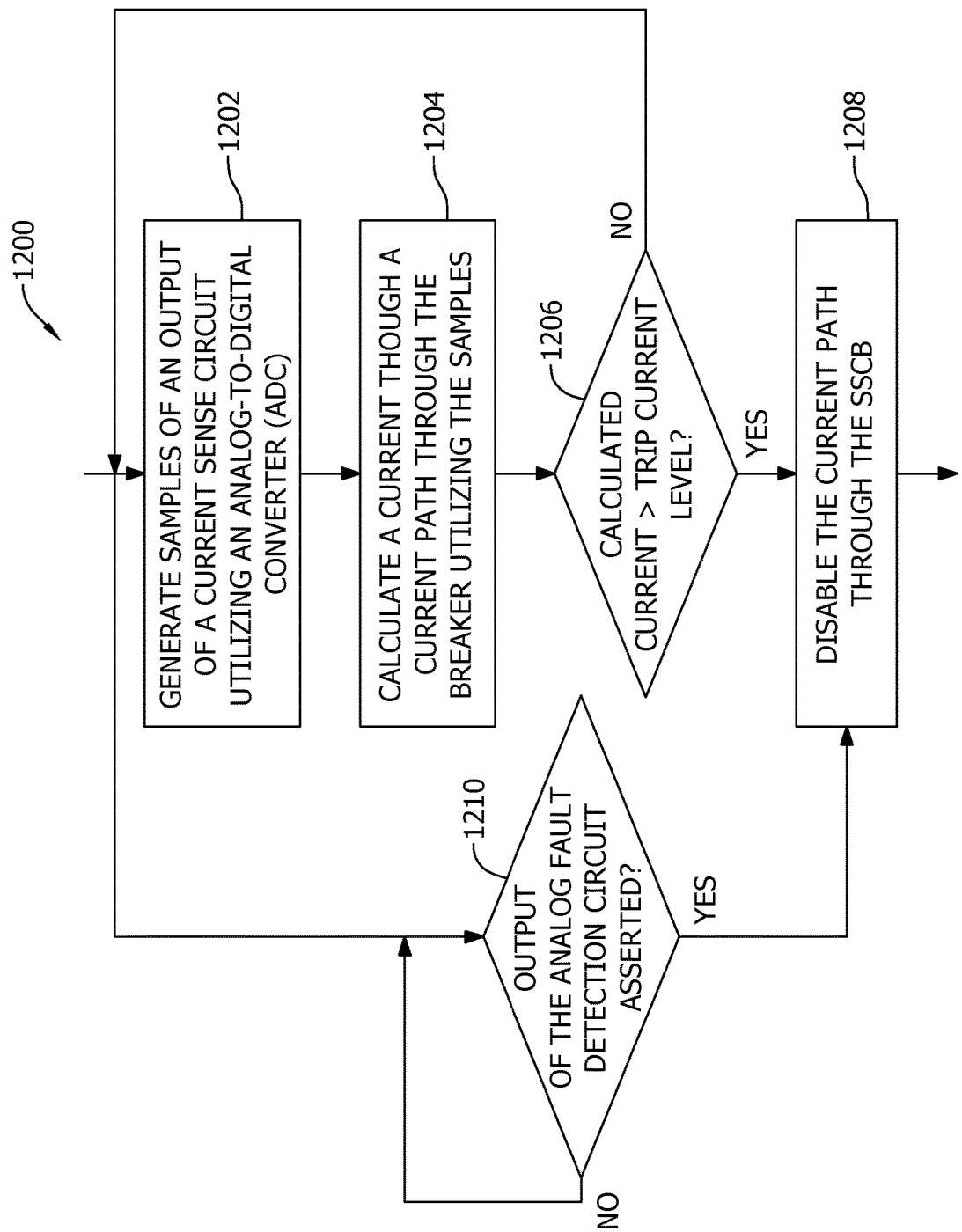
FIG. 12 depicts a flow chart of a method of operating a SSCB in an exemplary embodiment.

FIG. 12 is a flow chart of a method 1200 of operating a SSCB in an exemplary embodiment. The SSCB includes an analog fault detection circuit having a first di/dt detection bandwidth, and at least one ADC having a second di/dt detection bandwidth that is less than the first di/dt detection bandwidth. Method 1200 may be performed by one or more systems shown and described with respect to FIGS. 1-11.

Method 1200 begins by (a) generating (1202) samples of a first output of a current sense circuit utilizing the at least one ADC, where the first output is representative of a current through a current path of the SSCB. For example, ADC 318 of MCU 314 generates samples of the output of current sense circuit 410 (see FIG. 3).

Method 1200 continues by (b) calculating (1204) the current through the current path based on the samples. For example, MCU 314 converts the sample values generated by ADC 318 into a representation of a current flowing through current path 304 (see FIG. 3).

Method 1200 continues by (c) determining (1206) whether the calculated current through the current path exceeds a trip current level for the SSCB. For example, MCU 314 compares the calculated current to a trip current level stored at MCU 314 to determine whether the calculated current flowing through current path 304 is greater than the trip current level (see FIG. 3).

Method 1200 continues by (d) disabling (1208) the current path through the SSCB in response to determining that the calculated current exceeds the trip current level for the SSCB. For example, MCU 314 modifies control signal(s) 316 to command power semiconductors 312 to turn off (see FIG. 3).

Method 1200 continues by (e), concurrently with (a), (b), and (c), determining (1210) whether a second output of an analog fault detection circuit is asserted, where the analog fault detection circuit is configured to assert the second output in response to the current through the current path exceeding the trip current level for the SSCB. Method 1200 continues by (f) disabling (1208) the current path through the SSCB in response to determining that the second output is asserted. For example, high di/dt fault detection circuit 326 operates to detect high di/dt faults concurrently and asynchronously with MCU 314 operating to detect low and medium di/dt faults. High di/dt fault detection circuit 326 asserts an output that generates an interrupt at MCU 314, and in response, MCU 314 modifies control signal(s) 316 to command power semiconductors 312 off. MCU 314 may, for example, suspend currently executing software and execute an interrupt handler in order to quickly turn power semiconductors 312 off (See FIG. 3).

In an optional embodiment, method 1200 further comprises determining, by the analog fault detection circuit, a magnitude of a di/dt of the current through the current path, and modifying, by the analog fault detection circuit, a value of the trip current level based on the magnitude of the di/dt of the current. For example, high di/dt fault detection circuit 326 (see FIG. 3) detects the magnitude of the di/dt of the current flowing through current path, 304, and modifies the trip current level based on the magnitude of the di/dt.

In another option embodiment, method 1200 further comprises determining, by a trip level selector coupled with the first output of the current sense circuit, a polarity of the current through the current path, and modifying, by the trip level selector, the value of the trip current level based on the polarity. For example, trip level selector 324 (see FIG. 3) detects the polarity of the current flowing through current path 304 and modifies the trip current level based on the direction of the current.

In another optional embodiment, method 1200 further comprises generating at least one programmable reference that modifies the value of the trip current level based on the polarity and selecting either the trip level selector or the at least one programmable reference as a modifier of the value of the trip current level. For example, DPU 414 (see FIG. 4), utilizes DAC 448 to generate programmable references 450, 452, which modifies the positive current and negative trip current levels at high di/dt fault detection circuit 432, and also generates reference selection signal 442 to select between using current polarity detector 434 or programmable references 450, 452 to specify the +/− polarity trip current levels.

In another optional embodiment, method 1200 further comprises determining a voltage polarity across a pair of anti-parallel solid-state switches, where the pair of anti-parallel solid-state switches are configured to selectively enable and disable the current path through the SSCB, and where the SSCB is configured as a bidirectional breaker. In this embodiment, method 1200 further comprises alternating which one of the pair of anti-parallel solid-state switches is conducting based on the voltage polarity. For example, power semiconductors 412 may comprise anti-parallel solid-state switches, and voltage polarity detection circuit 424 (and ADC 420) are used to determine the polarity of power semiconductors 412. DPU 414 utilizes control signal(s) 416 to alternate which one of power semiconductors 412 is conducting, which depends upon the direction of current inferred from the voltage polarity across power semiconductors 412.

In this embodiment, method 1200 may further comprise determining whether the voltage is within a threshold amount of zero volts and turning off the pair of anti-parallel stolid state switches in response to determining that the voltage is within a threshold amount of zero volts. For example, DPU 414 utilizes control signal(s) 416 to turn both of power semiconductors 412 off when the voltage across power semiconductors 412 (detected via voltage polarity detection circuit 424 and ADC 420) is near the zero crossing (see FIG. 4).

In another optional embodiment, method 1200 further comprises determining whether a voltage polarity across an RB-IGCT has reversed, where the RB-IGCT is configured to selectively enable and disable the current path through the SSCB based on at least one control signal, and where the SSCB is configured as a unidirectional breaker. In this embodiment, method 1200 further comprises disabling the current path through the SSCB utilizing the at least one control signal in response to determining that the voltage polarity across the RB-IGCT has reversed. For example, DPU 414 may determine that the voltage across power semiconductors 412 has reversed (via voltage polarity detection circuit 424 and ADC 420), and DPU 414 utilizes control signal(s) 416 to turn off power semiconductor 412.

An example technical effect of the apparatus and method described herein includes at least one of: (a) reducing the high-speed loading of SSCB controllers by offloading high di/dt detections to analog circuits; (b) minimize nuisance tripping using a flexible digital+analog trip logic; (c) increase the reliability of the fault protection due to the use of both hardware and software fault detection systems; (d) mitigate negative leakage currents for RB-IGCT based unidirectional breakers; and (e) provide enhance fault protection of bidirectional breakers by selectively turning on one of the anti-parallel devices at a time that depends upon the direction of current.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A solid-state circuit breaker (SSCB), comprising:
at least one solid-state switch configured to selectively enable and disable a current path through the SSCB based on at least one control signal;
a current sense circuit configured to sense a current through the current path and generate a first output representative of the current;
an analog fault detection circuit coupled with the first output and configured to assert a second output in response to the current through the current path exceeding a trip current level for the SSCB, wherein the analog fault detection circuit has a first di/dt detection bandwidth; and
a controller coupled with the second output and configured to:
(a) generate samples of the first output utilizing at least one analog-to-digital converter (ADC), wherein the at least one ADC has a second di/dt detection bandwidth that is less than the first di/dt detection bandwidth;
(b) calculate the current through the current path based on the samples;
(c) determine whether the calculated current through the current path exceeds the trip current level for the SSCB;
(d) disable the current path through the SSCB utilizing the at least one control signal in response to determining that the calculated current exceeds the trip current level for the SSCB;
(e) concurrently with (a), (b) and (c), determine whether the second output is asserted; and
(f) disable the current path through the SSCB utilizing the at least one control signal in response to determining that the second output is asserted.

2. The SSCB of claim 1, wherein:
the analog fault detection circuit is further configured to:
determine a magnitude of a di/dt of the current through the current path; and
modify a value of the trip current level based on the magnitude of the di/dt of the current.

3. The SSCB of claim 1, further comprising:
a trip level selector coupled with the first output of the current sense circuit, wherein the trip level selector is configured to:
determine a polarity of the current through the current path; and
modify a value of the trip current level based on the polarity.

4. The SSCB of claim 3, further comprising:
at least one digital-to-analog converter (DAC) that is configured to generate at least one programmable reference that modifies the value of the trip current level based on the polarity,
wherein the controller is further configured to generate a reference selection signal that selects either the trip level selector or the at least one programmable reference as a modifier of the trip current level.

5. The SSCB of claim 1, wherein:
the at least one solid-state switch comprises a pair of anti-parallel solid-state switches, and the SSCB is configured as a bidirectional breaker,
the SSCB further comprises a voltage polarity detection circuit configured to generate a third output representative of a voltage polarity across the pair of anti-parallel solid-state switches, and
the controller is further configured to:
measure, using the at least one ADC, the third output of the voltage polarity detection circuit;
determine, based on the measurement, the voltage polarity across the pair of anti-parallel solid-state switches; and
alternate, utilizing the at least one control signal, which one of the pair of anti-parallel solid-state switches is conducting based on the voltage polarity.

6. The SSCB of claim 5, wherein:
the controller is further configured to:
determine whether a voltage across the pair of anti-parallel solid-state switches is within a threshold amount of zero volts; and
turn off the pair of anti-parallel solid-state switches utilizing the at least one control signal in response to determining that the voltage is within the threshold amount of zero volts.

7. The SSCB of claim 1, wherein:
the at least one solid-state switch comprises a reverse-blocking integrated gate commutated thyristor (RB-IGCT), and the SSCB is configured as a unidirectional breaker,
the SSCB further comprises a voltage polarity detection circuit configured to generate a third output representative of a voltage polarity across the RB-IGCT, and
the controller is further configured to:
measure, using the at least one ADC, the third output of the voltage polarity detection circuit;
determine, based on the measurement, whether the voltage polarity across the RB-IGCT has reversed; and disable the current path through the SSCB utilizing the at least one control signal in response to determining that the voltage polarity across the RB-IGCT has reversed.

8. A method of operating a solid-state circuit breaker (SSCB), the SSCB including an analog fault detection circuit having a first di/dt detection bandwidth, and at least one analog-to-digital converter (ADC) having a second di/dt detection bandwidth that is less than the first di/dt detection bandwidth, the method comprising:
(a) generating samples of a first output of a current sense circuit utilizing the at least one ADC, wherein the first output is representative of a current through a current path of the SSCB;
(b) calculating the current through the current path based on the samples;
(c) determining whether the calculated current through the current path exceeds a trip current level for the SSCB;
(d) disabling the current path through the SSCB in response to determining that the calculated current exceeds the trip current level for the SSCB;
(e) concurrently with (a), (b), and (c), determining whether a second output of the analog fault detection circuit is asserted, wherein the analog fault detection circuit is configured to assert the second output in response to the current through the current path exceeding the trip current level for the SSCB; and
(f) disabling the current path through the SSCB in response to determining that the second output is asserted.

9. The method of claim 8, further comprising:
determining, by the analog fault detection circuit, a magnitude of a di/dt of the current through the current path; and
modifying, by the analog fault detection circuit, a value of the trip current level based on the magnitude of the di/dt of the current.

10. The method of claim 8, further comprising:
determining, by a trip level selector coupled with the first output of the current sense circuit, a polarity of the current through the current path; and
modifying, by the trip level selector, a value of the trip current level based on the polarity.

11. The method of claim 10, further comprising:
generating at least one programmable reference that modifies the value of the trip current level based on the polarity; and
selecting either the trip level selector or the at least one programmable reference as a modifier of the value of the trip current level.

12. The method of claim 8, further comprising:
determining a voltage polarity across a pair of anti-parallel solid-state switches, wherein the pair of anti-parallel solid-state switches are configured to selectively enable and disable the current path through the SSCB, and wherein the SSCB is configured as a bidirectional breaker; and
alternating which one of the pair of anti-parallel solid-state switches is conducting based on the voltage polarity.

13. The method of claim 12, further comprising:
determining whether a voltage across the pair of anti-parallel solid-state switches is within a threshold amount of zero volts; and
turning off the pair of anti-parallel solid-state switches in response to determining that the voltage is within the threshold amount of zero volts.

14. The method of claim 8, further comprising:
determining whether a voltage polarity across a reverse-blocking integrated gate commutated thyristor (RB-IGCT) has reversed, wherein the RB-IGCT is configured to selectively enable and disable the current path through the SSCB based on at least one control signal, and wherein the SSCB is configured as a unidirectional breaker; and
disabling the current path through the SSCB utilizing the at least one control signal in response to determining that the voltage polarity across the RB-IGCT has reversed.

15. A solid-state circuit breaker (SSCB), comprising:
at least one solid-state switch configured to selectively enable and disable a current path through the SSCB based on at least one control signal;
a current sense circuit configured to sense a current through the current path and generate a first output representative of the current;
an analog fault detection circuit coupled with the first output and configured to assert a second output in response to the first output indicating that the current through the current path exceeds a trip current level for the SSCB, wherein the analog fault detection circuit has a first di/dt detection bandwidth;
at least one analog-to-digital converter (ADC) configured to generate samples of the first output, wherein the at least one ADC has a second di/dt detection bandwidth that is less than the first di/dt detection bandwidth; and
a controller configured to disable the current path through the SSCB utilizing the at least one control signal in response to determining, concurrently, that:
the second output is being asserted by the analog fault detection circuit; or
the samples indicate that the current through the current path exceeds the trip current level for the SSCB.

16. The SSCB of claim 15, wherein:
the analog fault detection circuit is further configured to:
determine a magnitude of a di/dt of the current through the current path; and
modify a value of the trip current level based on the magnitude of the di/dt of the current.

17. The SSCB of claim 15, further comprising:
a trip level selector coupled with the first output of the current sense circuit, wherein the trip level selector is configured to:
determine a polarity of the current through the current path; and
modify a value of the trip current level based on the polarity.

18. The SSCB of claim 17, further comprising:
at least one digital-to-analog converter (DAC) that is configured to generate at least one programmable reference that modifies the value of the trip current level based on the polarity,
wherein the controller is further configured to generate a reference selection signal that selects either the trip level selector or the at least one programmable reference as a modifier of the trip current level.

19. The SSCB of claim 15, wherein:
the at least one solid-state switch comprises a pair of anti-parallel solid-state switches, and the SSCB is configured as a bidirectional breaker,
the SSCB further comprises a voltage polarity detection circuit configured to generate a third output representative of a voltage polarity across the pair of anti-parallel solid-state switches, and the controller is further configured to:
- measure, using the at least one ADC, the third output of the voltage polarity detection circuit;
- determine, based on the measurement, the voltage polarity across the pair of anti-parallel solid-state switches; and
- alternate, utilizing the at least one control signal, which one of the pair of anti-parallel solid-state switches is conducting based on the voltage polarity.

20. The SSCB of claim 19, wherein:

the controller is further configured to:
- determine whether a voltage across the pair of anti-parallel solid-state switches is within a threshold amount of zero volts; and
- turn off the pair of anti-parallel solid-state switches utilizing the at least one control signal in response to determining that the voltage is within the threshold amount of zero volts.

21. The SSCB of claim 15, wherein:

the at least one solid-state switch comprises a reverse-blocking integrated gate commutated thyristor (RB-IGCT), and the SSCB is configured as a unidirectional breaker, the SSCB further comprises:
- a voltage polarity detection circuit configured to generate a third output representative of a voltage polarity across the RB-IGCT, and the controller is further configured to:
- measure, using the at least one ADC, the third output of the voltage polarity detection circuit;
- determine, based on the measurement, whether the voltage polarity across the RB-IGCT has reversed; and
- disable the current path through the SSCB utilizing the at least one control signal in response to determining that the voltage polarity across the RB-IGCT has reversed.

* * * * *